(12) United States Patent
Wang

(10) Patent No.: US 10,475,362 B2
(45) Date of Patent: Nov. 12, 2019

(54) SHIFT REGISTER AND DRIVING METHOD, GATE DRIVING CIRCUIT AND DISPLAY DEVICE

(71) Applicants: BOE Technology Group Co., Ltd., Beijing (CN); Hefei Xinsheng Optoelectronics Technology Co., Ltd., Hefei (CN)

(72) Inventor: Zixuan Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/569,216

(22) PCT Filed: Apr. 28, 2017

(86) PCT No.: PCT/CN2017/082328
§ 371 (c)(1),
(2) Date: Oct. 25, 2017

(87) PCT Pub. No.: WO2018/076645
PCT Pub. Date: May 3, 2018

(65) Prior Publication Data
US 2018/0293924 A1    Oct. 11, 2018

(30) Foreign Application Priority Data
Oct. 31, 2016  (CN) .......................... 2016 1 0928693

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01);
(Continued)

(58) Field of Classification Search
CPC ............... G09G 3/20; G09G 2320/045; G09G 2310/061; G09G 2310/08; G09G 2310/0286; G09G 2320/041; G11C 19/28
See application file for complete search history.

(56) References Cited

U.S. PATENT DOCUMENTS 9,373,414 B2 *  6/2016  Shang .................... G11C 19/28
9,620,061 B2 *  4/2017  Cao ....................... G09G 3/3258
(Continued)

FOREIGN PATENT DOCUMENTS

CN    104064158 A    9/2014
CN    104318883 A    1/2015
(Continued)

OTHER PUBLICATIONS

Jul. 28, 2017—(WO) International Search Report and the Opinion Appn PCT/CN2017/082328 with English Tran.
(Continued)

Primary Examiner — Vinh T Lam
(74) Attorney, Agent, or Firm — Banner & Witcoff, Ltd.

(57) ABSTRACT

A shift register, a gate driving circuit, a display device and a driving method. The shift register includes: a driving unit, configured to supply a gate line signal to a corresponding pixel unit group; and a compensation circuit provided corresponding to the driving unit; where the compensation circuit is configured to compensate for one or more threshold voltage offsets of one or more transistors in the driving unit.

16 Claims, 9 Drawing Sheets

(52) U.S. Cl.
CPC ... *G09G 2310/061* (2013.01); *G09G 2310/08* (2013.01); *G09G 2320/041* (2013.01); *G09G 2320/043* (2013.01); *G09G 2320/045* (2013.01)

(56) References Cited

U.S. PATENT DOCUMENTS

| | | | | |
|---|---|---|---|---|
| 2008/0013670 A1* | 1/2008 | Lo | ............ | G11C 19/28 377/79 |
| 2010/0188385 A1* | 7/2010 | Boiko | ............ | G09G 3/3677 345/211 |
| 2011/0134090 A1* | 6/2011 | Iwamoto | ............ | G09G 3/3677 345/206 |
| 2014/0085285 A1* | 3/2014 | Kim | ............ | G09G 3/3266 345/211 |
| 2014/0091997 A1* | 4/2014 | Han | ............ | G09G 3/3677 345/92 |
| 2014/0191937 A1* | 7/2014 | Xu | ............ | G09G 3/3648 345/99 |
| 2015/0317954 A1* | 11/2015 | Jang | ............ | G09G 3/20 345/213 |
| 2016/0260403 A1 | 9/2016 | Dai | | |
| 2017/0018244 A1* | 1/2017 | Jen | ............ | G09G 3/3677 |
| 2017/0123556 A1* | 5/2017 | Lin | ............ | G06F 3/0412 |
| 2017/0270879 A1 | 9/2017 | Han et al. | | |

FOREIGN PATENT DOCUMENTS

| | | |
|---|---|---|
| CN | 104332144 A | 2/2015 |
| CN | 105206243 A | 12/2015 |
| CN | 106356015 A | 1/2017 |

OTHER PUBLICATIONS

Sep. 17, 2019—(CN) Second Office Action Appn 201610928693.X with English Translation.

* cited by examiner

SHIFT REGISTER AND DRIVING METHOD, GATE DRIVING CIRCUIT AND DISPLAY DEVICE

The application is a U.S. National Phase Entry of International Application No. PCT/CN2017/082328 filed on Apr. 28, 2017, designating the United States of America and claiming priority to Chinese Patent Application No. 201610928693.X filed on Oct. 31, 2016. The present application claims priority to and the benefit of the above-identified applications and the above-identified applications are incorporated by reference herein in their entirety.

TECHNICAL FIELD

Embodiments of the present disclosure relate to a shift register and a driving method, a gate driving circuit and a display device.

BACKGROUND

Today, people not only have a high requirement on appearance and quality of a product, but also have a higher interest in a price and practicality of the product. In a display field, an unstable factor caused by a transistor threshold voltage may further cause instability of operation of a gate driving circuit that includes a plurality of transistors, and may result in a shortened service life of the gate driving circuit.

SUMMARY

At least an embodiment of the disclosure provides a shift register, comprising: a driving unit, configured to supply a gate line signal to a corresponding pixel unit group; and a compensation circuit provided corresponding to the driving unit; wherein the compensation circuit is configured to compensate for one or more threshold voltage offsets of one or more transistors in the driving unit.

For example, in some embodiments of the shift register, the compensation circuit includes: a compensation transistor, a gate electrode of the compensation transistor being connected with a compensation control line, a first electrode of the compensation transistor being connected with a first compensation signal line, and a second electrode of the compensation transistor being connected with a pull-up node; wherein the compensation control line is used for supplying a control signal to the gate electrode of the compensation transistor for controlling turning on of the compensation transistor; and the first compensation signal line is used for supplying a positive compensation voltage or a negative compensation voltage to the first electrode of the compensation transistor.

For example, in some embodiments of the shift register, the compensation circuit includes a first compensation transistor and a second compensation transistor, the first compensation transistor being an N-type transistor and the second compensation transistor being a P-type transistor; a gate electrode of the first compensation transistor is connected with a second compensation signal line and a first electrode of the first compensation transistor, and a second electrode of the first compensation transistor is connected with a pull-up node of the driving unit; a gate electrode of the second compensation transistor is connected with the second compensation signal line and a first electrode of the second compensation transistor, and a second electrode of the second compensation transistor is connected with the pull-up node of the driving unit; the second compensation signal line is used for supplying a compensation voltage to the first electrode of the first compensation transistor or the first electrode of the second compensation transistor.

For example, in some embodiments of the shift register, the driving unit includes: a pull-up circuit, configured to output a first clock signal as the gate line signal; a pull-up control circuit, configured to control a turning-on time of the pull-up circuit; a pull-down circuit, configured to pull down the gate line signal to a low voltage level at a first time period; a pull-down maintaining circuit, configured to maintain the low voltage level of the gate line signal; and a pull-down maintaining control circuit, configured to maintain a pull-down control point at the low voltage level; wherein the pull-up circuit or the pull-down maintaining control circuit at least includes a transistor; and the compensation circuit is configured to write a compensation voltage into part of transistors in the pull-up circuit or the pull-down maintaining control circuit.

For example, in some embodiments of the shift register, the pull-up control circuit includes a first transistor, a first electrode of the first transistor is connected with an input signal line to receive an input signal, a gate electrode of the first transistor is connected with the first electrode of the first transistor, and a second electrode of the first transistor is connected with a pull-up node; the pull-up circuit includes a second transistor, a gate electrode of the second transistor is connected with the pull-up node, a first electrode of the second transistor is connected with a first clock terminal, and a second electrode of the second transistor is connected with an output terminal; the pull-down circuit includes a third transistor, a first electrode of the third transistor is connected with the output terminal, a gate electrode of the third transistor is connected with a reset signal line, a second electrode of the third transistor is connected with a first power line, the first power line is used for transmitting a first voltage, and the reset signal line is used for transmitting a reset signal; the pull-down maintaining control circuit includes a fourth transistor and a fifth transistor, a first electrode of the fourth transistor is connected with a second clock signal line, a gate electrode of the fourth transistor is connected with a second pull-down node, a second electrode of the fourth transistor is connected with a first pull-down node; a first electrode of the fifth transistor is connected with the first pull-down node, a gate electrode of the fifth transistor is connected with the pull-up node, a second electrode of the fifth transistor is connected with the first power line; the second clock signal line is used for transmitting a second clock signal, and the first power line is used for transmitting the first voltage; the pull-down maintaining circuit includes a sixth transistor and a seventh transistor, first electrodes of both the sixth transistor and the seventh transistor are connected with the first power line, gate electrodes of both the sixth transistor and the seventh transistor are connected with the first pull-down node, and second electrodes of the sixth transistor and the seventh transistor are connected with the pull-up node, and the first power line is used for transmitting the first voltage.

For example, in some embodiments of the shift register, the pull-down maintaining control circuit further includes an eighth transistor and a ninth transistor; a first electrode of the eighth transistor is connected with the second pull-down node, a gate electrode of the eighth transistor is connected with the pull-up node, and a second electrode of the eighth transistor is connected with the first power line; a first electrode of the ninth transistor is connected with the second clock signal line to receive the second clock signal, a gate electrode of the ninth transistor is connected with the first electrode of the ninth transistor, and a second electrode of the ninth transistor is connected with the second pull-down node.

For example, in some embodiments of the shift register, the shift register further comprises a reset circuit, configured to make the pull-up node to discharge during an initialization phase.

For example, in some embodiments of the shift register, the reset circuit includes a tenth transistor, a first electrode of the tenth transistor is connected with the pull-up node, a gate electrode of the tenth transistor is connected with the reset signal terminal, and a second electrode of the tenth transistor is connected with the first power line.

At least an embodiment of the disclosure further provides a gate driving circuit, comprising the shift register described above.

At least an embodiment of the disclosure further provides a display device, comprising the gate driving circuit described above and a display panel connected with the gate driving circuit.

For example, in some embodiments of the display device, the display device further comprises: a timing and temperature-measuring device, configured to measure an operation time and an operation temperature of a respective driving unit of the gate driving circuit when the display panel is operating, then to obtain a threshold voltage offset state of a transistor in a pull-up circuit or a pull-down maintaining control circuit of the respective driving unit based on the measured operation time and operation temperature, and finally to calculate a compensation time period and a compensation voltage for the transistor according to the threshold voltage offset state; a control device, configured to store the compensation voltage and the compensation time period calculated by the timing and temperature-measuring device, and to supply the compensation voltage to the compensation circuit corresponding to the respective driving unit of the gate driving circuit; and a built-in power supply, configured to supply power to the compensation circuit of the gate driving circuit and the control device.

For example, in some embodiments of the display device, the control device is further configured to: supply the compensation voltage to the compensation circuit of the gate driving circuit, when it is determined that the display panel is in a shutdown state, wherein the compensation voltage is used for performing threshold voltage compensation on part of transistors in the pull-up circuit or the pull-down maintaining control circuit of the driving unit.

For example, in some embodiments of the display device, the control device is further configured to supply the compensation voltage to the compensation circuit within the compensation time period.

For example, in some embodiments of the display device, the compensation voltage includes a positive compensation voltage or a negative compensation voltage; when positive bias voltage compensation is executed, the control device transmits the positive compensation voltage to the first compensation signal line; and when negative bias voltage compensation is executed, the control device transmits the negative compensation voltage to the first compensation signal line.

At least an embodiment of the disclosure further provides a driving method for driving the shift register described above, comprising: in a charging phase, setting an input signal to a valid signal, setting a first clock signal to an invalid signal, setting a second clock signal to the valid signal, and setting a reset signal to an off voltage; in an outputting phase, setting the input signal to the invalid signal, setting the first clock signal to the valid signal, setting the second clock signal to the invalid signal, and setting the reset signal to the off voltage; in a discharging phase, setting the input signal to the invalid signal, setting the first clock signal to the invalid signal, setting the second clock signal to the invalid signal, and setting the reset signal to an on voltage; in a maintaining phase, setting the input signal to the invalid signal, setting the first clock signal to the invalid signal, setting the second clock signal to the invalid signal, and setting the reset signal to the off voltage; and in a compensation phase, setting the input signal to the invalid signal, setting the first clock signal to the invalid signal, setting the second clock signal to the invalid signal, setting the reset signal to the off voltage, setting a compensation control signal to the on voltage and setting the first compensation signal line to transmit the valid signal within a compensation time period, or setting the second compensation signal line to transmit the valid signal within the compensation time period.

BRIEF DESCRIPTION OF THE DRAWINGS

In order to illustrate the technical solutions in the embodiments of the present disclosure more clearly, the drawings needed to be used in the description of the embodiments will be briefly described in the following; it is obvious that the drawings described below are only related to some embodiments of the present disclosure, and are not to be limitative to the disclosure.

DETAILED DESCRIPTION

Hereafter, in order to illustrate the purposes, technical solutions and advantages in the embodiments of the present disclosure more clearly, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. Words such as "include" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect.

An embodiment of the present disclosure provides a shift register having a threshold drift correction function. During an inoperation period of a display panel, in an embodiment of the present disclosure, a negative gate voltage or a positive gate voltage is applied to a plurality of transistors in the shift register, so as to eliminate threshold voltage drift generated by a display device during operation, to further extend a service life of a gate shift register. In addition, in an embodiment of the present disclosure, threshold voltage compensation is performed on related transistors during the inoperation period of the display device, so that power consumption of the display device is relatively small, and therefore, it is possible to greatly extend the service life of the shift register, which is particularly applicable to display devices similar such as a public display used in an application scenario which requires sustained and stable operation for super-long time.

Figure 1:
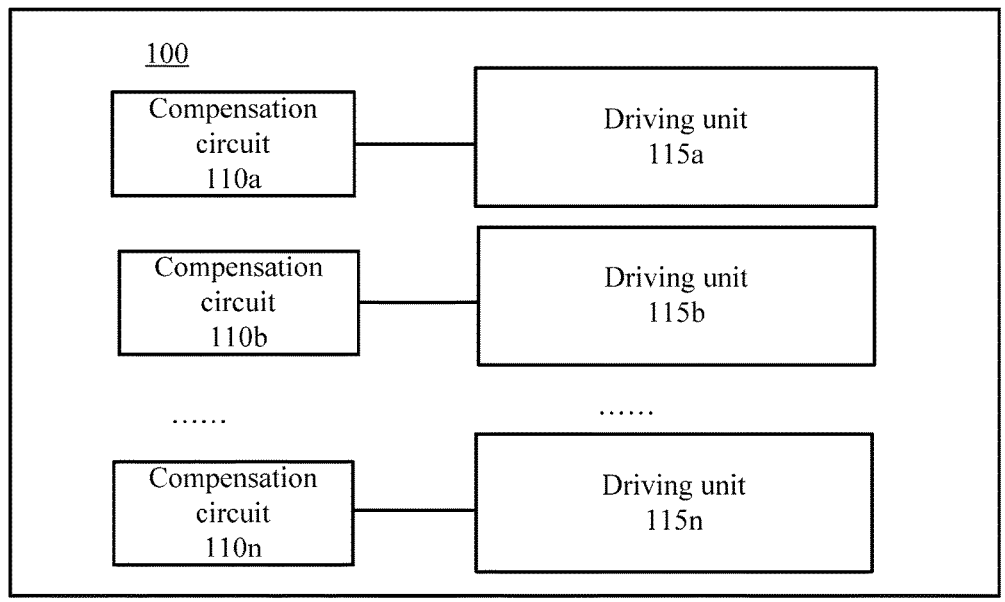
FIG. 1 is a schematic diagram of a shift register provided by an embodiment of the present disclosure.

An embodiment of the present disclosure provides a shift register, comprising: a driving unit, configured to supply a gate line signal to a corresponding pixel unit group; and a compensation circuit corresponding to the driving unit; where the compensation circuit is configured to compensate for threshold voltage offset of one or more transistors in the driving unit. As shown in FIG. 1, the shift register 100 comprises: a plurality of driving units 115 (e.g., 115a, 115b, . . . , 115n) and compensation circuits 110 (e.g., 110a, 110b, . . . , 110n) corresponding to the driving units 115 in a one-by-one correspondence. A respective driving unit 115 may be configured to provide a gate line signal to a corresponding pixel unit group. The respective compensation circuit 110 is configured to compensate for the threshold voltage offset of one or more transistors in the driving unit 115 corresponding thereto. Of course, the shift register 100 may comprise one or more driving units 115 and one or more compensation circuits 110 that correspond to respective driving units 115 one by one. With respect to the number of driving units 115 and compensation circuits 110 comprised in one shift register 100, it will be not limited in the present disclosure here.

In some embodiments, a structure of a pixel unit group is related to an arrangement mode of pixel units on a display panel. For example, when the pixel units are arranged in rows, a pixel unit group is an entire row of pixel units. When the pixel units are arranged in columns, a pixel unit group may be an entire column of pixel units. In embodiments of the present disclosure, the arrangement mode of the pixel units will not be limited; for example, the pixel units may also be arranged on the display panel in oblique lines, and at this scenario, a pixel unit group may be all the pixel units included in an oblique line.

In some embodiments, one or more transistors compensated by a compensation circuit 110 are related to a specific circuit structure of a driving unit 115. Typically, the driving unit 115 includes a plurality of transistors, and these transistors may be used as a timing control transistor or an output transistor. Because different transistors during operation are in different states, their degrees of threshold voltage drift are also different. Thus, it is needed to obtain transistors which need to be compensated by the compensation circuit 110 according to operation states of respective transistors in a specific driving circuit. For example, the compensation circuit 110 may be used for compensating for a pull-down transistor included in the driving unit 115. In addition, the driving units 115a, 115b, . . . , 115n shown in FIG. 1 may be respectively referred to as a first-stage driving unit 115a, a second-stage driving unit 115b, . . . , an nth-stage driving unit 115n.

Hereinafter, two different types of compensation circuits are analyzed below in conjunction with FIG. 2A and FIG. 2B.

Figure 2A:
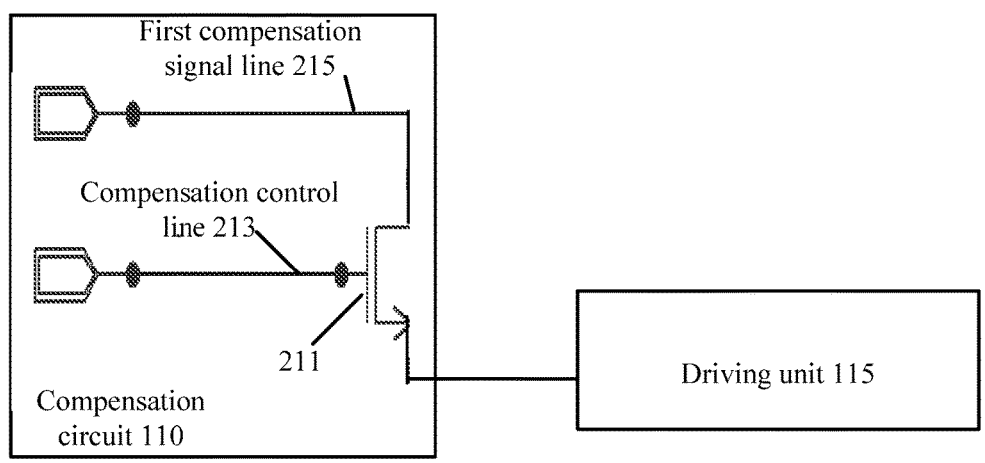
FIG. 2A is a schematic diagram of a compensation circuit provided by an embodiment of the present disclosure.

FIG. 2A shows a specific structure of one type of compensation circuit 110 provided by an embodiment of the present disclosure. The compensation circuit 110 may include: a compensation transistor 211, a gate electrode of the compensation transistor 211 being connected with a compensation control line 213, a first electrode of the compensation transistor 211 being connected with a first compensation signal line 215, a second electrode of the compensation transistor 211 being connected with a pull-up node (shown in FIG. 3A) in the driving unit 115. The compensation control line 213 is used for supplying a control signal to the gate electrode of the compensation transistor 211 for controlling turning on of the compensation transistor 211, and for example, the control signal may be a pulse signal. In addition, the first compensation signal line is used for supplying a positive compensation voltage or a negative compensation voltage to the first electrode of the compensation transistor 211.

For example, when the compensation control line 213 shown in FIG. 2A supplies a high voltage level to the gate electrode of the compensation transistor 211, the compensation transistor 211 is turned on; and at this time, a high voltage level signal is input by the first compensation signal line 215 to implement positive bias voltage compensation for one or more transistors in the driving unit 115, or a low voltage level signal is input by the first compensation signal line 215 to implement negative bias voltage compensation for one or more transistors in the driving unit 115.

The compensation circuit 110 provided by FIG. 2A may perform positive bias voltage compensation or negative bias voltage compensation for one or more transistors included in the driving unit 115, so as to correct drift of threshold voltage Vth of the compensated transistor and improve the service life of the gate driving circuit.

Figure 2B:
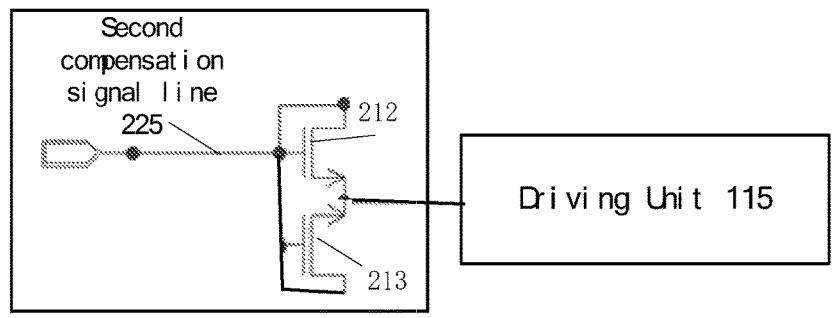
FIG. 2B is a schematic diagram of a compensation circuit provided by another embodiment of the present disclosure.

FIG. 2B shows another structural schematic diagram of a compensation circuit 110 provided by an embodiment of the present disclosure. The compensation circuit 110 includes a first compensation transistor 212 and a second compensation transistor 213, where one of the first compensation transistor 212 and the second compensation transistor 213 is an N-type transistor and the other is a P-type transistor. In addition, with reference to FIG. 2B, it can be seen that a gate electrode of the first compensation transistor 212 is connected with both a second compensation signal line 225 and a first electrode of the first compensation transistor 212, and a second electrode of the first compensation transistor 212 is connected with a pull-up node (shown in FIG. 3A) of a corresponding driving unit. A gate electrode of the second compensation transistor 213 is connected with both the second compensation signal line 225 and a first electrode of the second compensation transistor 213 at a same time, and a second electrode of the second compensation transistor 213 is connected with the pull-up node (shown in FIG. 3A) of the corresponding driving unit. For example, the second electrode of the first compensation transistor 212 is connected with the second electrode of the second compensation transistor 213; the gate electrode of the first compensation transistor 212 is connected with the gate electrode of the second compensation transistor 213; where the second compensation signal line 225 is used for supplying a compensation voltage to the first electrode of the first compensation transistor 212 or to the first electrode of the second compensation transistor 213. For example, the second compensation signal line 225 shown in FIG. 2B may be used for supplying a positive compensation voltage or a negative compensation voltage to the first electrode of the first compensation transistor 212 or the first electrode of the second compensation transistor 213, to perform bias voltage compensation on one or more transistors in the driving unit 115. For example, the second compensation signal line 225 may be used for loading a positive compensation voltage to the gate electrode and the first electrode of the first compensation transistor 212, so that the first compensation transistor 212 is turned on, and then the second electrode of the first compensation transistor 212 outputs the positive compensation voltage to the pull-up node. At a same time, the second compensation signal line 225 may be used for loading a negative compensation voltage to the gate electrode and the first electrode of the second compensation transistor 213, so that the second compensation transistor 213 is turned on, and then the second electrode of the second compensation transistor 213 outputs the negative compensation voltage to the pull-up node. Specifically, a high voltage level signal may be input by the second compensation signal line 225 shown in FIG. 2B to turn on the first compensation transistor 212, so as to implement positive bias voltage compensation for one or more transistors in the driving unit 115. Alternatively, a low voltage level signal may also be input by the second compensation signal line 225 shown in FIG. 2B to turn on the second compensation transistor 213, so as to implement negative bias voltage compensation for one or more transistors in the driving unit 115.

Hereinafter, in conjunction of the circuit structure of the driving unit provided by FIG. 3A to FIG. 3C, the shift register and the gate driving circuit will be further described below.

Figure 3A:
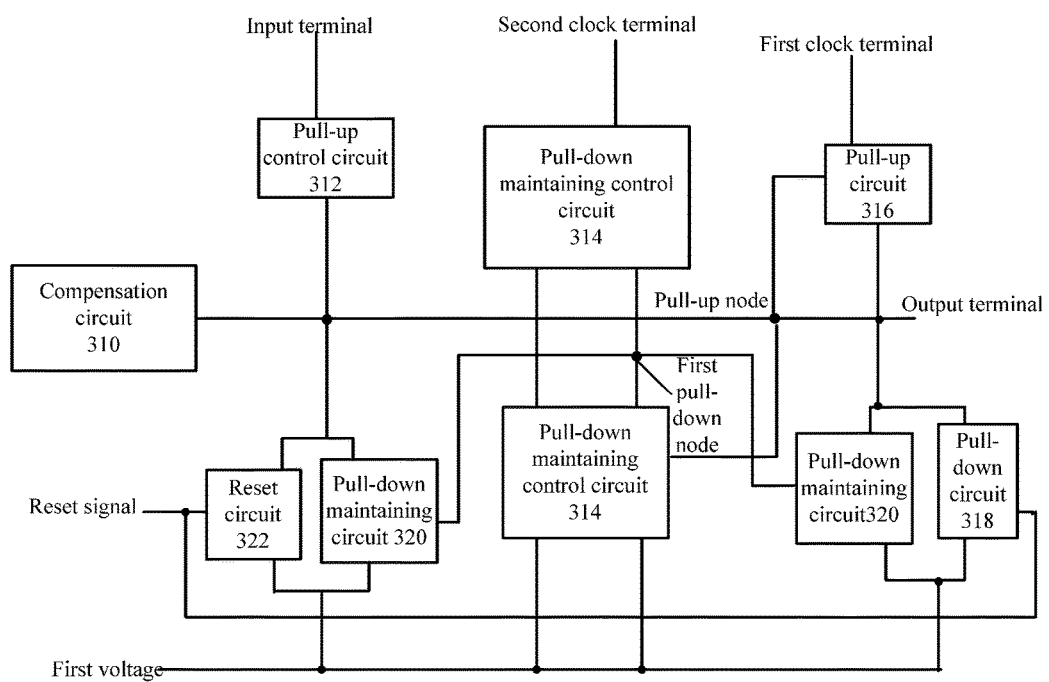
FIG. 3A is a schematic block diagram of a driving unit and a compensation circuit provided by an embodiment of the present disclosure.

FIG. 3A shows only one driving unit in the shift register and one compensation circuit 310 provided corresponding to the driving unit. A structure of the compensation circuit 310 may be the same as or similar to the structure of the compensation circuit 110 shown in FIG. 2A or FIG. 2B. The driving unit shown in FIG. 3A may include: a pull-up circuit 316, a pull-up control circuit 312, a pull-down circuit 318, a pull-down maintaining circuit 320 and a pull-down maintaining control circuit 314.

The pull-up circuit 316 is configured to output a first clock signal as a gate line signal (the gate line signal may be transmitted to the pixel unit group as, for example, a display scan signal). The pull-up control circuit 312 is configured to control a turning-on time of the pull-up circuit 316. The pull-down circuit 318 is configured to pull down the gate line signal output by the output terminal to be a low voltage level at a first time period. The pull-down maintaining circuit 320 is configured to maintain a low voltage level state of the gate line signal. The pull-down maintaining control circuit 314 is configured to maintain a pull-down control point (e.g., a first pull-down node shown in the diagram) at a low voltage level. For example, the pull-up circuit 316 or the pull-down maintaining control circuit 314 at least includes a transistor. The compensation circuit 310 is configured to write a compensation voltage into part of transistors in the pull-up circuit 316 or the pull-down maintaining control circuit 314.

For example, the pull-up control circuit 312 is connected with an input terminal to receive an input signal; and for example, the input signal may be a signal output by an output terminal of a driving unit of a previous stage. The pull-down maintaining control circuit 314 is connected with a second clock terminal to receive a second clock signal. The pull-up circuit 316 is connected with the first clock terminal to receive the first clock signal; for example, the first clock signal is a pulse signal. The pull-down circuit 318 and the pull-down maintaining circuit 320 are also connected with a first power line to receive a first voltage. For example, the first voltage may be a low voltage-level signal. For example, the input signal at the input terminal is a signal output by the output terminal of a driving unit of a previous stage (for example, with respect to the second-stage driving unit 115b shown in FIG. 1, a driving unit of a previous stage is the first-stage driving unit 115a). The second clock signal and the first clock signal have inverted phases. A reset signal on a reset line is a signal output by the output terminal of a driving unit of a next stage (for example, with respect to the first-stage driving unit 115a shown in FIG. 1, a driving unit of a next stage is the second electrode driving unit 115b). Since the driving unit 115a does not have any driving unit of a previous stage, a pulse activation signal may be input to its input terminal.

For example, the driving unit may further include a reset circuit 322, the reset circuit 322 being connected with the reset signal line to receive the reset signal. The reset circuit 322 is configured to make the pull-up node to discharge during an initialization phase, to prepare for stable operation of the driving unit.

For example, the driving unit shown in FIG. 3A further includes a second pull-down node (shown in FIG. 3B and FIG. 3C), and the first pull-down node and the second pull-down node are respectively connected with the pull-down maintaining control circuit 314.

Figure 3B:
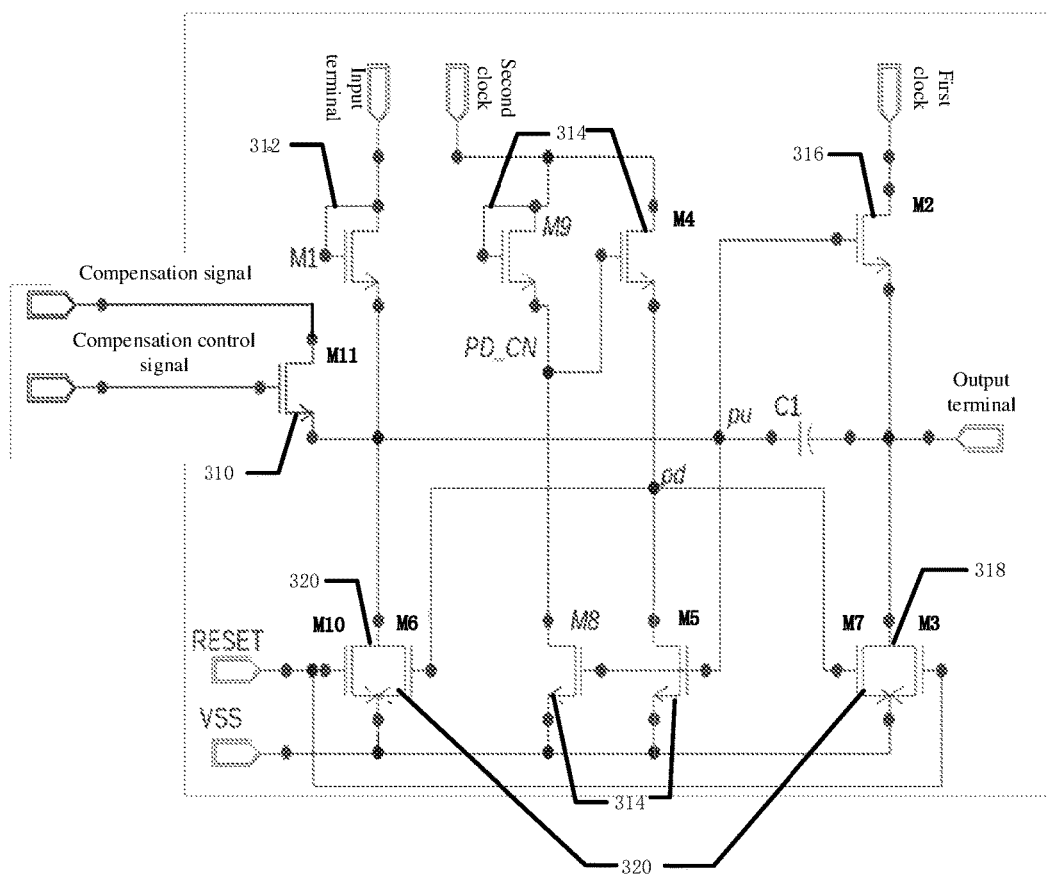
FIG. 3B is an example circuit diagram of the driving unit and the compensation circuit shown in FIG. 3A.
Figure 3C:
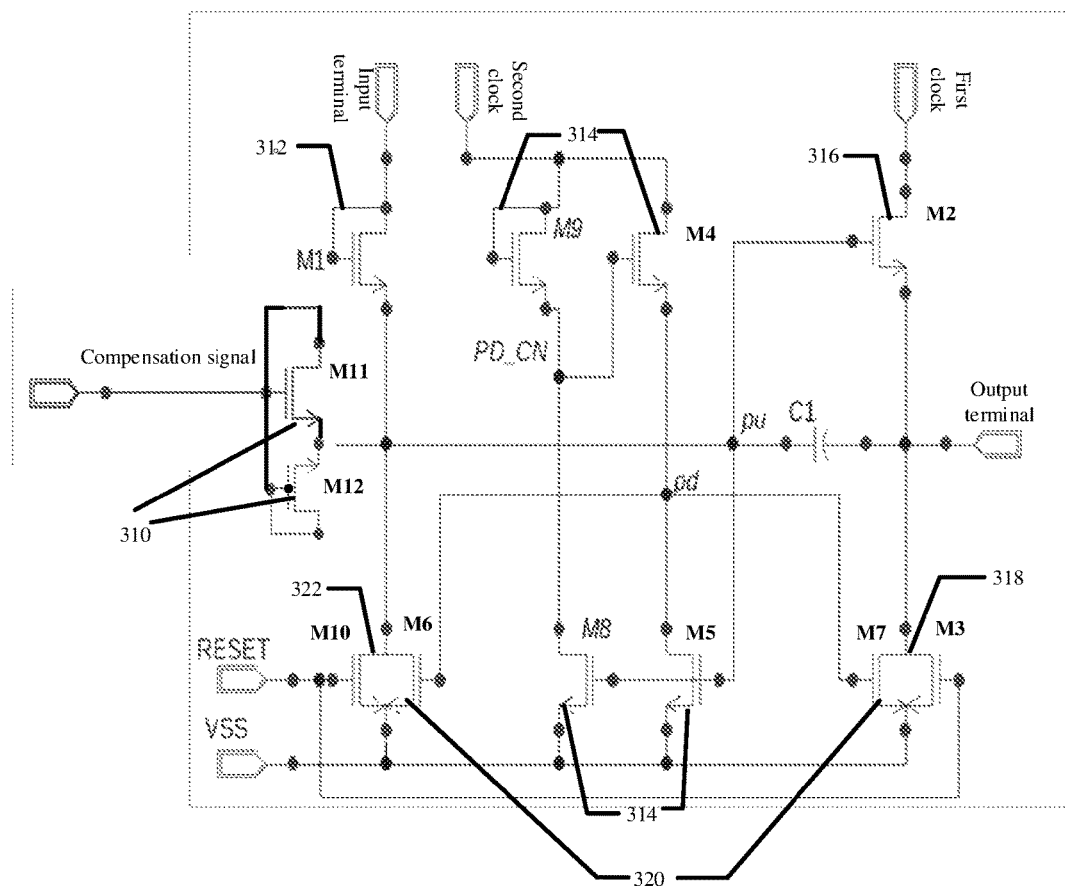
FIG. 3C is another example circuit diagram of the driving unit and the compensation circuit shown in FIG. 3A.

Hereinafter, using a case where all the transistors in FIG. 3B and FIG. 3C are the N-type transistors as an example, the structure of the shift register shown in FIG. 3A will be described in detail.

FIG. 3B shows a driving unit and a compensation circuit in the shift register. The pull-up control circuit 312 of the driving unit includes a first transistor M1, a first electrode of the first transistor M1 is connected with an input signal line to receive an input signal, a gate electrode of the first transistor M1 is connected with the first electrode of the first transistor M1, and a second electrode of the first transistor M1 is connected with a pull-up node pu. The pull-up circuit 316 of the driving unit includes a second transistor M2, a gate electrode of the second transistor M2 is connected with the pull-up node pu, a first electrode of the second transistor M2 is connected with a first clock terminal, and a second electrode of the second transistor M2 is connected with an output terminal. The pull-down circuit 318 of the driving unit includes a third transistor M3, a first electrode of the third transistor M3 is connected with the output terminal, a gate electrode of the third transistor M3 is connected with the reset signal line, a second electrode of the third transistor M3 is connected with the first power line, and for example, a first power line is used for transmitting a first voltage VSS;

the reset signal line is used for transmitting the reset signal; the pull-down maintaining circuit includes a sixth transistor M6 and a seventh transistor M7, first electrodes of both the sixth transistor M6 and the seventh transistor M7 are connected with the first power line, gate electrodes of both the sixth transistor M6 and the seventh transistor M7 are connected with the first pull-down node pd, a second electrode of the sixth transistor M6 is connected with the first pull-up node pu and a second electrode of the seventh transistor M7 is connected with the output terminal; the first power line is used for transmitting the first voltage VSS; the pull-down maintaining control circuit includes a fourth transistor M4 and a fifth transistor M5; a first electrode of the fourth transistor M4 is connected with the second clock signal line, a gate electrode of the fourth transistor M4 is connected with a second pull-down node PD-CN, a second electrode of the fourth transistor M4 is connected with the first pull-down node pd; a first electrode of the fifth transistor M5 is connected with the first pull-down node pd, a gate electrode of the fifth transistor M5 is connected with pull-up node pu, a second electrode of the fifth transistor M5 is connected with the first power line; where the second clock signal line is used for transmitting a second clock signal, and the first power line is used for transmitting the first voltage VSS.

For example, FIG. 3B shows that the pull-down maintaining control circuit 314 of the driving unit may further include an eighth transistor M8 and a ninth transistor M9; a first electrode of the eighth transistor M8 is connected with the second pull-down node PD-CN, a gate electrode of the eighth transistor M8 is connected with the pull-up node pu, a second electrode of the eighth transistor M8 is connected with the first power line VSS; a first electrode of the ninth transistor M9 is connected with the second clock signal line to receive the second clock signal, a gate electrode of the ninth transistor M9 is connected with the first electrode of the ninth transistor M9, and a second electrode of the ninth transistor M9 is connected with the second pull-down node PD-CN.

For example, the reset circuit of the driving unit shown in FIG. 3B includes a tenth transistor M10, a first electrode of the tenth transistor M10 is connected with the pull-up node pu, a gate electrode of the tenth transistor M10 is connected with the reset signal line to receive the reset signal RESET, a second electrode of the tenth transistor M10 is connected with the first power line to receive the first voltage VSS.

For example, for the compensation circuit shown in FIG. 3B, the compensation circuit provided by FIG. 2A may be referred to. At this point, the output terminal of the compensation circuit is connected with the pull-up node pu. For example, by the compensation circuit of FIG. 3B, it is possible to implement positive bias voltage compensation or negative bias voltage compensation on the second transistor M2 included in the pull-up circuit and on the fifth transistor M5 and the eighth transistor M8 included in the pull-up maintaining circuit 314.

In addition, with respect to the driving unit compensated by the compensation circuit shown in FIG. 3B, an analysis process for the transistors included in the driving unit is as follows: with respect to a driving unit in the shift register of an array substrate gate driving circuit shown in FIG. 3B, the driving unit controls a voltage of the first pull-down node pd with a second clock signal having a phase inverted to that of the first clock signal, to reduce a noise level when the output terminal outputs the VGL, to further maintain stable operation of the shift register. In conjunction with FIG. 3B, it can be known that the voltage of the first pull-down node (the pd point) is controlled by the fourth transistor M4, the fifth transistor M5, the eighth transistor M8 and the ninth transistor M9, and thus, it can be known that states of the four transistors, i.e., the fourth transistor M4, the fifth transistor M5, the eighth transistor M8 and the ninth transistor M9, can determine normal operation of the gate driving circuit. External factors that affect threshold voltage offset under a condition of sustained operation of a transistor mainly include two points: one is a voltage applied to the gate electrode of the transistor, and the other is a duty cycle of the voltage signal applied to the gate electrode. In this example, duty cycles of gate voltages of the four transistors, i.e., the fourth transistor M4, the fifth transistor M5, the eighth transistor M8 and the ninth transistor M9, are significantly different. Table 1 below lists estimated duty cycles. Hereinafter, only a failure phenomenon of the gate driving circuit due to threshold voltage Vth drift of the transistor is considered. In combination with Table 1, it can be seen that, duty cycles of voltages applied to the gate electrodes of the fifth transistor M5 and the eighth transistor M8 which are responsible for pulling-down the first pull-down node pd and the second pull-down node PD-CN are about 99.2% when the gate driving circuit is operating, which is much higher than those of the fourth transistor M4 and the ninth transistor M9 which are responsible for charging the first pull-down node pd and the second pull-down node PD-CN, and the second transistor M2 responsible for outputting also has a problem of a high negative voltage pressure. Thus, after sustained operation for a relatively long time, threshold voltage Vth offsets of the fifth transistor M5 and the eighth transistor M8 may have severe negative drift, causing the fifth transistor M5 and the eighth transistor M8 to be easily turned on at a low gate voltage, to further result in instability of the gate driving circuit. At this time, if a noise is input to the pull-up node pu, the fifth transistor M5 and the eighth transistor M8 may be turned on at a same time, causing the first pull-down node pd to a low level; and a discharging effect produced by the sixth transistor M6 on the pull-up node pu is weakened due to reduction of its gate voltage, the noise of the pull-up node pu is accumulated because it fails to be released rapidly, and is transferred to a subsequent row when outputted from the second transistor M2, resulting in failure of the entire gate driving circuit.

TABLE 1

| Serial number | Node | Duty cycle |
| --- | --- | --- |
| M5 | PD-CN | 50% |
| M3 | pu | 99.2% |
| M6 | pu | 99.2% |
| M8 | pu | 99.2% |
| M9 | Second clock | 50% |

Threshold voltage offsets of the second transistor M2, the fifth transistor M5 and the eighth transistor M8 included in the driving unit may be compensated by the compensation circuit shown in FIG. 3B, and the offsets here include positive offsets or negative offsets. In addition, for the compensation circuit shown in FIG. 3B, reference may be made to the compensation circuit provided by FIG. 2A and the compensation circuit shown in FIG. 2B.

FIG. 3C differs from FIG. 3B in a compensation circuit portion; and for a specific structure of the compensation circuit of FIG. 3C, the compensation circuit provided by FIG. 2B may be referred to. The compensation circuit provided by FIG. 3C may also compensate for threshold voltage offset of the second transistor M2, the fifth transistor M5 and the eighth transistor M8 included in the driving unit, and the compensation here includes only positive offset compensation. For example, threshold voltage offsets of the second transistor M2, the fifth transistor M5 and the eighth transistor M8 are compensated by the positive bias voltage provided by a second compensation signal of FIG. 2B (corresponding to a compensation signal of FIG. 3C).

It should be noted that, all the transistors used in the embodiments of the present disclosure may be thin film transistors or field effect transistors or other switching devices having a same characteristic. A source electrode and a drain electrode of the transistor used here may be symmetrical in structure, so that there may be no difference between the source electrode and the drain electrode in structure. In embodiments of the present disclosure, in order to distinguish the two electrodes other than the gate electrode of the transistor, one electrode therein is directly described as the first electrode, and the other is described as the second electrode, and the first electrodes and the second electrodes of all or part of the transistors in embodiments of the present disclosure are interchangeable according to needs. For example, the first electrode of the transistor as described may be the source electrode in embodiments of the present disclosure, and the second electrode may be the drain electrode; or the first electrode of the transistor is the drain electrode, and the second electrode is the source electrode. In addition, the transistor may be divided into an N-type or a P-type transistor according to the characteristic of the transistor; in embodiments of the present disclosure, it is illustrated with a case where the first transistor M1, the second transistor M2, the third transistor M3, the fourth transistor M4, the fifth transistor M5, the sixth transistor M6 and the seventh transistor M7 are all the N-type transistors as an example. Based on description and teachings of the implementations in the present disclosure, those skilled in the art can easily conceive of the implementations in which the P-type transistors or a combination of the N-type transistors and the P-type transistors are used without any additional inventive work, which should be within the protection scope of the present disclosure.

An embodiment of the present disclosure further provides a gate driving circuit, comprising any one of the shift registers as described above. For example, the gate driving circuit may comprise a plurality of cascaded shift registers.

Figure 4:
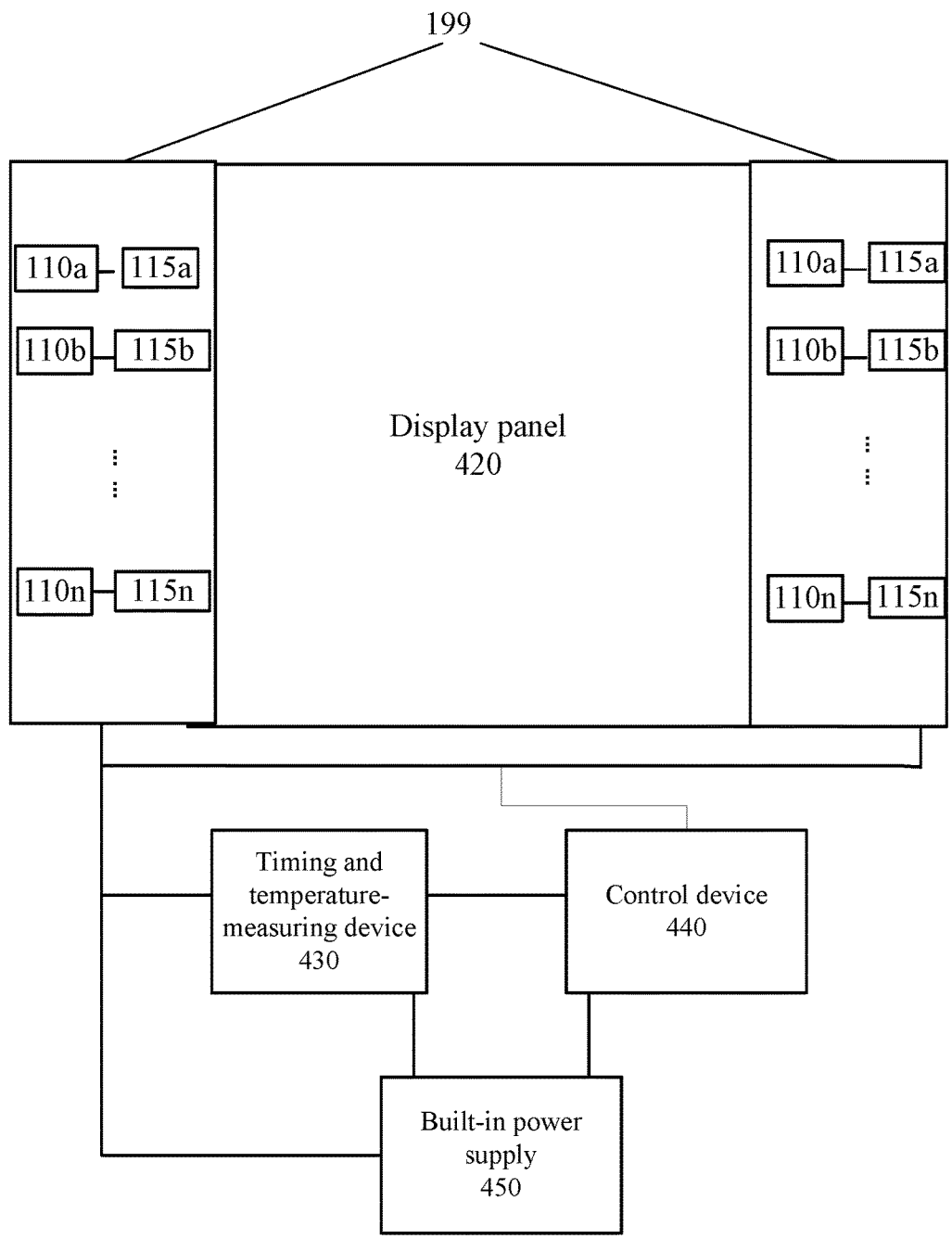
FIG. 4 is a schematic diagram of a display device provided by an embodiment of the present disclosure.

As shown in FIG. 4, an embodiment of the present disclosure further provides a display device, the display device comprising a gate driving circuit 199 (which includes shift registers) and a display panel 420 connected with the gate driving circuit 199. FIG. 4 shows the shift registers in the gate driving circuit 199, which comprise compensation circuits (110a, 110b, . . . , 110n) and driving units (115a, 115b, . . . , 115n) provided corresponding to the respective compensation circuits; and for specific structures of the compensation circuit and the driving unit, FIG. 1, FIG. 2A to FIG. 2B, and FIG. 3A to FIG. 3C may be referred to. In addition, FIG. 4 shows only part of the units comprised in the display device; for example, the display device of FIG. 4 may further comprise a data driving circuit, a plurality of scanning lines, a plurality of data lines or a clock circuit (not shown), and the like.

In some embodiments, the display device further comprises: a timing and temperature-measuring device 430, a control device 440, and a built-in power supply 450. The timing and temperature-measuring device 430 is configured to measure an operation time and operation temperature of respective driving units 115 of the gate driving circuit 199 when the display panel 420 is started up, then to obtain a threshold voltage offset state of a transistor in a pull-up circuit or a pull-down maintaining control circuit of a respective driving unit 115 based on the measured time and temperature, and finally to calculate a compensation time period and a compensation voltage for the transistor according to the threshold voltage offset state. The control device 440 is configured to store the compensation voltage and the compensation time period calculated by the timing and temperature-measuring device 430, and to supply the compensation voltage to the compensation circuit 110 corresponding to the respective driving unit 115 of the gate driving circuit 199. The built-in power supply 450 is configured to supply power to the compensation circuit of the gate driving circuit 199 and the control device.

For example, in some embodiments, the timing and temperature-measuring device 430 may collect relevant data in real time with a timing sensor and a temperature-measuring sensor, and calculate the compensation voltage based on the collected data with a processor. The timing and temperature-measuring device 430 may further be provided with a memory, the memory may be used for pre-storing a threshold compensation comparison table, and the threshold compensation comparison table provides a threshold voltage compensation reference value or a threshold voltage compensation reference range according to each operation temperature and each operation time of the transistor. Thereafter, by table look-up, the timing and temperature-measuring device 430 can obtain a corresponding compensation voltage or a corresponding compensation range according to a measured operation time and a measured operation temperature of the transistor.

For example, in some embodiments, the control device 440 is further configured to: supply the compensation voltage obtained by the timing and temperature-measuring device 430 to the compensation circuit 110 of the gate driving circuit 199, when it is determined that the display panel is in a shutdown state. For example, the compensation voltage is used for performing threshold voltage compensation on part of the transistors in the pull-up circuit or the pull-down maintaining control circuit of the driving unit 115 connected with the compensation circuit 110.

For example, in some embodiments, the control device 440 is further configured to supply the compensation voltage to the compensation circuit 110 within the compensation time period calculated by the timing and temperature-measuring device 430.

For example, in some embodiments, the compensation voltage includes a positive compensation voltage or a negative compensation voltage. When positive bias voltage compensation is executed, the control device 440 transmits the positive compensation voltage to a first compensation signal line (for which the first compensation signal shown with reference to FIG. 2A may be specifically referred to). When negative bias voltage compensation is executed, the control device 440 transmits the negative compensation voltage to the first compensation signal line (shown in FIG. 2A).

For example, in some embodiments, the compensation voltage may include only the positive compensation voltage, and at this time, when it is monitored that the display panel is in an inoperative state, the control device 440 transmits the positive compensation voltage to a second compensation signal line (for which the second compensation signal line 225 shown with reference to FIG. 2B may be specifically referred to).

Figure 5A:
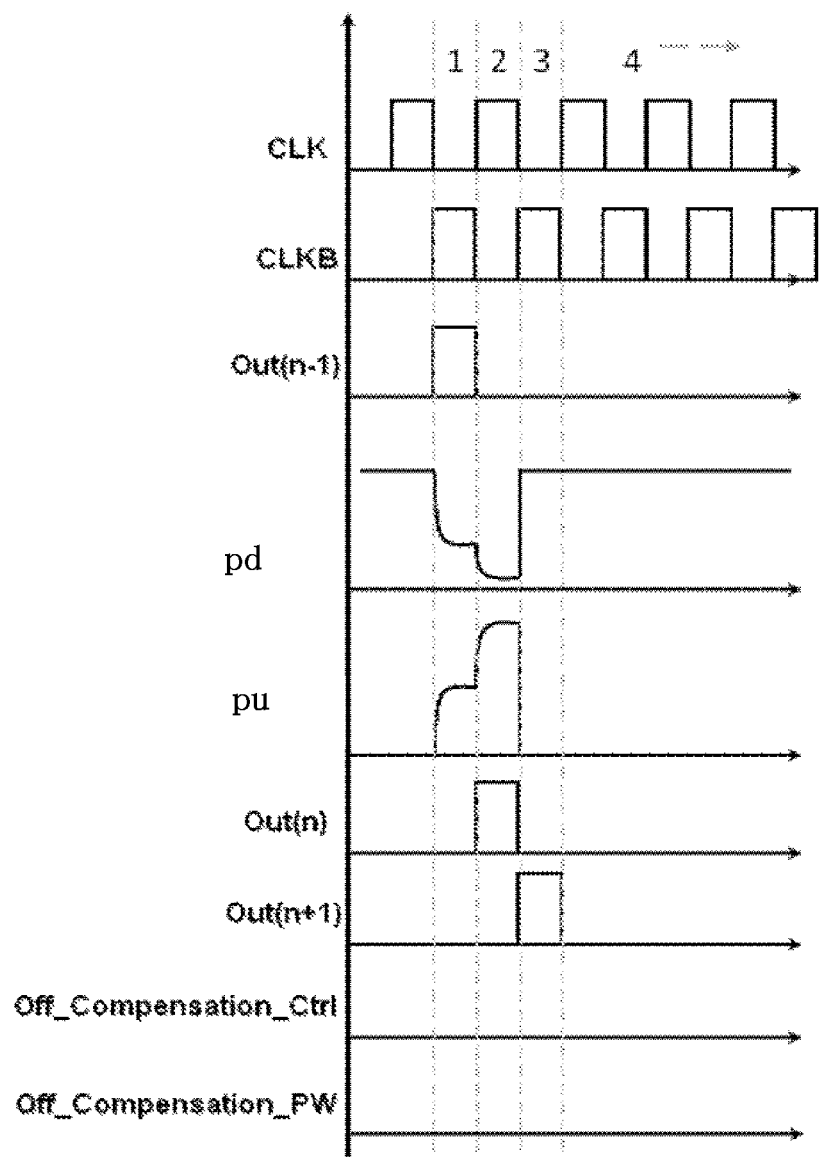
FIG. 5A and FIG. 5B are driving timing diagrams used in the circuit structure shown in FIG. 3B and FIG. 3C provided by an embodiment of the present disclosure.
Figure 5B:
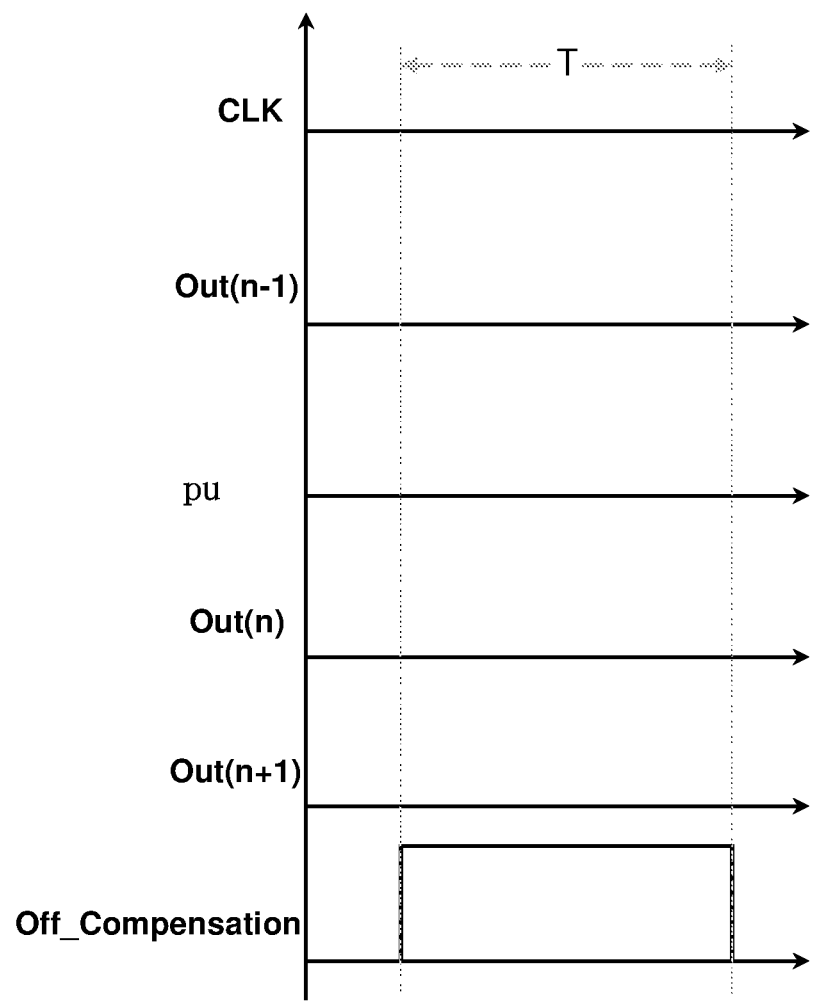
Figure 6A:
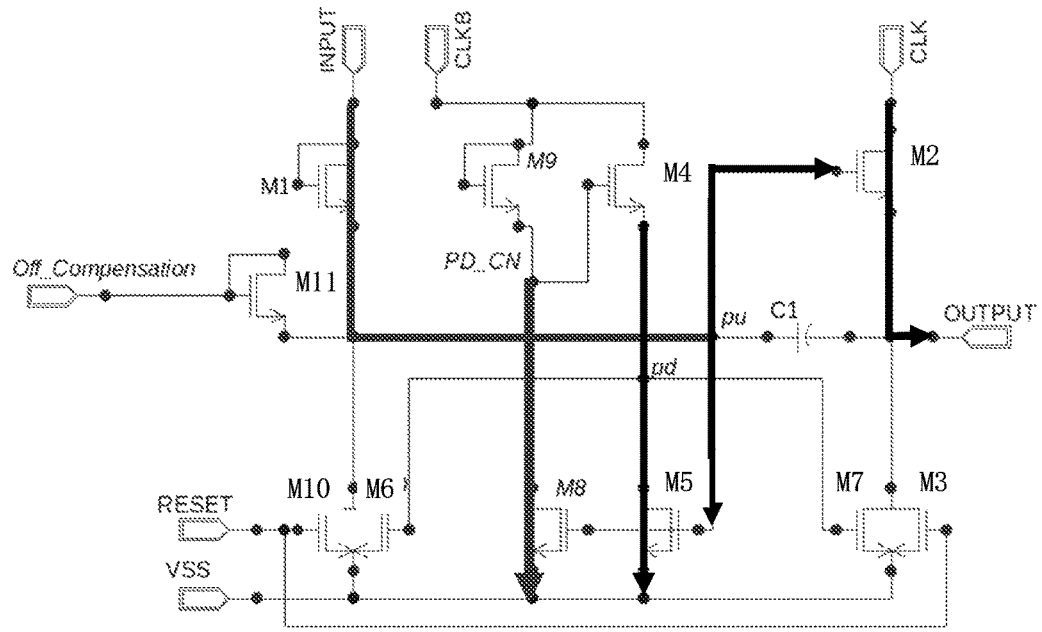
FIG. 6A to FIG. 6D are schematic diagrams of operation of respective transistors based on the timing diagram of FIG. 5B provided by an embodiment of the present disclosure.
Figure 6B:
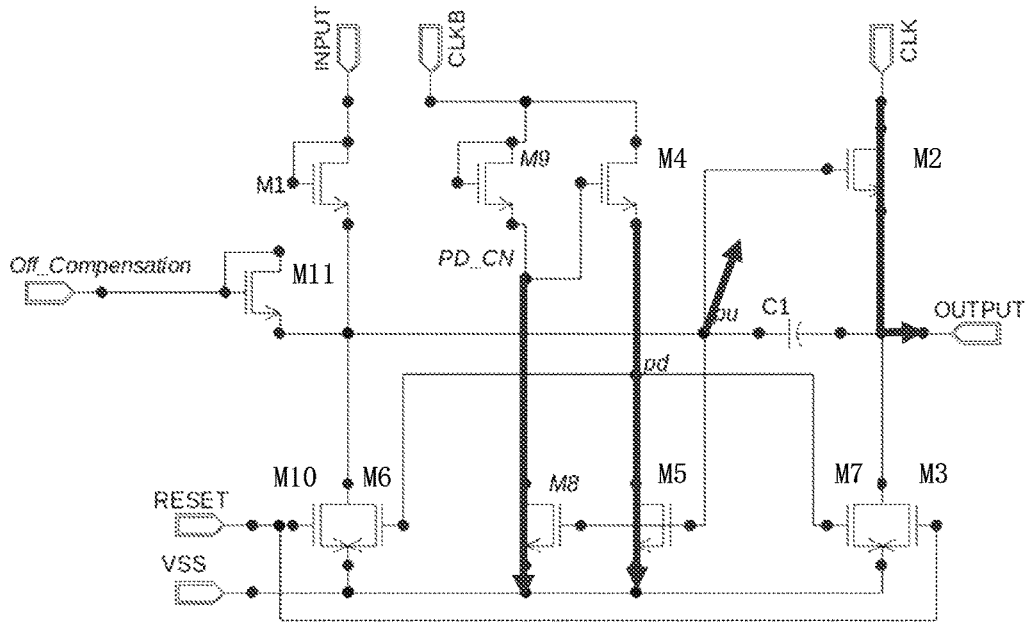
Figure 6C:
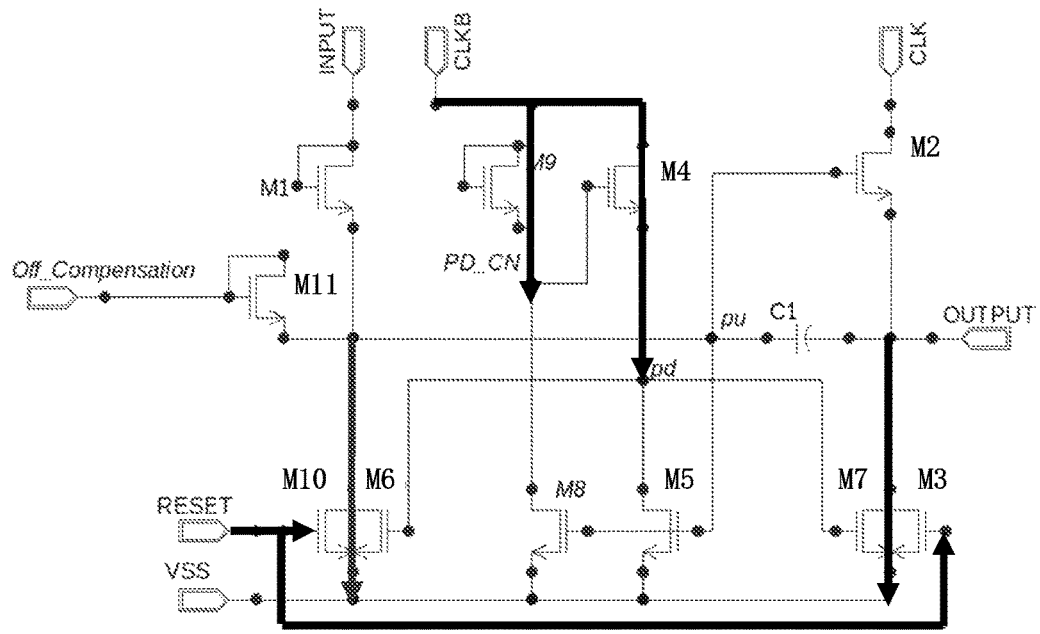
Figure 6D:
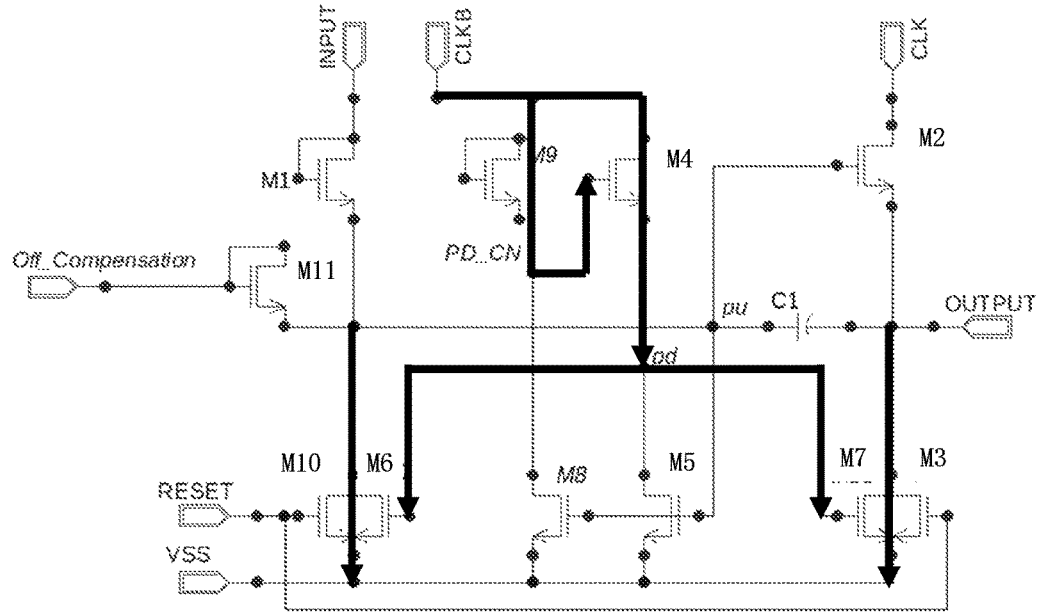

As shown in FIG. 5A and FIG. 5B, an embodiment of the present disclosure further provides a driving timing diagram for driving the shift register shown in FIG. 3B and FIG. 3C.

As shown in FIG. 5A, a driving method comprises a charging phase, an outputting phase, a discharging phase, a maintaining phase and a compensation phase.

In the charging phase 1, an input signal Out (n−1) is set to a valid signal, a first clock signal CLK is set to an invalid signal, a second clock signal CLKB is set to a valid signal, and a reset signal Out(n+1) is set to an off voltage. In the outputting phase 2, the input signal Out(n−1) is set to an invalid signal, the first clock signal CLK is set to a valid signal, the second clock signal CLKB is set to an invalid signal, and the reset signal Out(n+1) is set to an off voltage. In the discharging phase 3, the input signal Out(n−1) is set to an invalid signal, the first clock CLK signal is set to an invalid signal, the second clock signal CLKB is set to an invalid signal, and the reset signal Out(n+1) is set to an on voltage. In the maintaining phase 4, the input signal Out(n−1) is set to an invalid signal, the first clock signal CLK is set to an invalid signal, the second clock signal CLKB is set to an invalid signal, and the reset signal Out(n+1) is set to an off voltage. In the compensation phase, the input signal Out(n−1) is set to an invalid signal, the first clock signal CLK is set to an invalid signal, the second clock signal CLKB is set to an invalid signal, and the reset signal Out(n+1) is set to an off voltage, a compensation control signal Off_Compensation_Ctrl is set to an on voltage and the first compensation signal line Off_Compensation_PW is set to transmit a valid signal within the compensation time period T, or the second compensation signal line is set to transmit a valid signal within the compensation time period T (as shown in FIG. 5B). In some examples, the valid signal is a high-voltage signal, and the invalid signal is a low-voltage signal. In other examples, the valid signal is a low-voltage signal and the invalid signal is a high-voltage signal. It will not be limited in the present disclosure herein.

In the above example, the input signal Out(n−1) signal is a signal from an output terminal of a driving unit of a previous stage prior to the nth-stage driving unit (i.e., an (n−1)th-stage driving unit). The reset signal Out(n+1) signal is a signal from an output terminal of a driving unit of a next stage of the nth-stage driving unit (i.e., an (n+1)th-stage driving unit). In addition, when n is equal to 1, since there is no existence of a driving unit of a previous stage, the Out(n−1) signal may be set to an exciting pulse signal at this time. When n is a last-stage driving unit, there is no existence of a driving unit of a next stage, and at this time, an exciting pulse signal may also be set as the Out(n+1) signal.

Hereinafter, in conjunction with FIG. 4, FIG. 5A, FIG. 5B, and FIG. 6A to FIG. 6D, a driving process for driving the circuit of FIG. 3C will be described in detail.

When a display device is started up, a timing and temperature-measuring device 430 is responsible for counting an operation time and operation temperature of a driving unit 115, evaluating threshold voltage offset states of a second transistor M2, a fifth transistor M5 and a eighth transistor M8, and storing the evaluation result in a control device 440. The operation process of the circuit shown in FIG. 3B includes the charging process of Phase One, the outputting process of Phase Two, the discharging process of Phase Three, and the maintaining process of Phase Four, totally as four phases, and the timing diagrams of the respective phases may be referred to in FIG. 5A and FIG. 5B. In addition, transistors turned on in these four phases are shown in FIG. 6A to FIG. 6D respectively (where a compensation circuit portion in the diagram includes a first compensation transistor in FIG. 2B or a compensation transistor in the compensation circuit provided by FIG. 3C), where a thickened solid line in FIG. 6A to FIG. 6D indicates that the transistor is in an ON state, and the other portions not thickened indicate an OFF state.

Phase One: in the charging phase, the input signal Out (n−1) is input to an input terminal INPUT, a first transistor M1 is turned on, and a pull-up node pu is charged to Vgh (e.g., a high voltage level). The fifth transistor M5 and the eighth transistor M8 are turned on, to pull down a first pull-down node pd and a second pull-down node PD-CN to a low voltage level.

Phase Two: in the outputting phase, the pull-up node pu is pulled up to the high voltage level, the fifth transistor M5 and the eighth transistor M8 are turned on, to continue to perform discharging on the first pull-down node pd and the second pull-down node PD_CN. At this time, since the first clock signal CLK becomes the high voltage level, under an action of a capacitor C1 the pull-up node pu point is bootstrapped to a higher level, and the second transistor M2 is turned on more sufficiently to output the first clock CLK to the output terminal.

Phase Three: in the discharging phase, the Out(n+1) is input to a reset signal line RESET, a tenth transistor M10 and a third transistor M3 are turned on, to respectively perform discharging on the pull-up node pu and the output terminal; as the voltage level of the pull-up node pu decreases, the fourth transistor M4 and the fifth transistor M5 are turned on, to pull up the first pull-down node pd to the high voltage level.

Phase Four: in the maintaining phase, the pull-down node pd is already pulled up to the high voltage level in the discharging phase, and at this time, the fourth transistor M4, the ninth transistor M9, the sixth transistor M6 and the seventh transistor M7 are turned on, to pull down the pull-up node pu and the output terminal to the low voltage level, and to maintain the output of the driving unit as Vg1 (for example, the low voltage level) in the shutdown state of the display device.

A shutdown phase: in the shutdown state of the display device, the control device 440 relies on power supplied from a power supply device, to output a positive bias voltage to a second compensation signal line, and performs positive bias voltage compensation. The timing and transistors that are turned on at this time are shown in FIG. 5B, and the positive bias voltage causes an eleventh transistor M11 to be turned on, and the positive bias voltage is output to the pull-up node pu to apply the positive bias voltage to the second transistor M2, the fifth transistor M5 and the eighth transistor M8, which may eliminate negative threshold voltage Vth offsets accumulated by the three transistors during operation of the driving unit. In addition, an output time T of the second compensation signal Off_Compensation is calculated from data recorded by the timing and temperature-measuring device 430. After the restoring process is completed, the compensation circuit stops working.

Drawings of the embodiments of the present disclosure only refer to structures related with the embodiments of the present disclosure, and other structures may refer to general design. Without conflict, the embodiments of the present disclosure and different features in the embodiments may be combined with each other.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201610928693.X filed on Oct. 31, 2016, which is incorporated herein by reference in its entirety as part of the disclosure of the present application.

The invention claimed is:

1. A shift register, comprising:
a driving unit, configured to supply a gate line signal to a corresponding pixel unit group; and
a compensation circuit provided corresponding to the driving unit,
wherein the compensation circuit is configured to compensate for one or more threshold voltage offsets of one or more transistors in the driving unit;
the compensation circuit comprises a first compensation transistor and a second compensation transistor, the first compensation transistor being an N-type transistor and the second compensation transistor being a P-type transistor;
a gate electrode of the first compensation transistor is connected with a second compensation signal line and a first electrode of the first compensation transistor, and a second electrode of the first compensation transistor is connected with a pull-up node of the driving unit;
a gate electrode of the second compensation transistor is connected with the second compensation signal line and a first electrode of the second compensation transistor, and a second electrode of the second compensation transistor is connected with the pull-up node of the driving unit; and
the second compensation signal line is used for supplying a compensation voltage to the first electrode of the first compensation transistor or the first electrode of the second compensation transistor.

2. The shift register according to claim 1, wherein the driving unit comprises:
a pull-up circuit, configured to output a first clock signal as the gate line signal;
a pull-up control circuit, configured to control a turning-on time of the pull-up circuit;
a pull-down circuit, configured to pull down the gate line signal to a low voltage level at a first time period;
a pull-down maintaining circuit, configured to maintain the low voltage level of the gate line signal; and
a pull-down maintaining control circuit, configured to maintain a pull-down control point at the low voltage level;
wherein the pull-up circuit or the pull-down maintaining control circuit comprises a transistor; and
the compensation circuit is configured to write a compensation voltage into part of transistors in the pull-up circuit or the pull-down maintaining control circuit.

3. The shift register according to claim 2, wherein:
the pull-up control circuit comprises a first transistor, a first electrode of the first transistor is connected with an input signal line to receive an input signal, a gate electrode of the first transistor is connected with the first electrode of the first transistor, and a second electrode of the first transistor is connected with a pull-up node;
the pull-up circuit comprises a second transistor, a gate electrode of the second transistor is connected with the pull-up node, a first electrode of the second transistor is connected with a first clock terminal, and a second electrode of the second transistor is connected with an output terminal;

the pull-down circuit comprises a third transistor, a first electrode of the third transistor is connected with the output terminal, a gate electrode of the third transistor is connected with a reset signal line, a second electrode of the third transistor is connected with a first power line, the first power line is used for transmitting a first voltage, and the reset signal line is used for transmitting a reset signal;

the pull-down maintaining control circuit comprises a fourth transistor and a fifth transistor, a first electrode of the fourth transistor is connected with a second clock signal line, a gate electrode of the fourth transistor is connected with a second pull-down node, a second electrode of the fourth transistor is connected with a first pull-down node; a first electrode of the fifth transistor is connected with the first pull-down node, a gate electrode of the fifth transistor is connected with the pull-up node, a second electrode of the fifth transistor is connected with the first power line; the second clock signal line is used for transmitting a second clock signal; and the pull-down maintaining circuit comprises a sixth transistor and a seventh transistor, first electrodes of both the sixth transistor and the seventh transistor are connected with the first power line, gate electrodes of both the sixth transistor and the seventh transistor are connected with the first pull-down node, and a second electrode of the sixth transistor is connected with the pull-up node and a second electrode of the seventh transistor is connected with the output terminal.

4. The shift register according to claim 3, wherein:
the pull-down maintaining control circuit further comprises an eighth transistor and a ninth transistor;
a first electrode of the eighth transistor is connected with the second pull-down node, a gate electrode of the eighth transistor is connected with the pull-up node, and a second electrode of the eighth transistor is connected with the first power line; and
a first electrode of the ninth transistor is connected with the second clock signal line to receive the second clock signal, a gate electrode of the ninth transistor is connected with the first electrode of the ninth transistor, and a second electrode of the ninth transistor is connected with the second pull-down node.

5. The shift register according to claim 3, further comprising a reset circuit, configured to make the pull-up node to discharge during an initialization phase.

6. The shift register according to claim 5, wherein the reset circuit comprises a tenth transistor, a first electrode of the tenth transistor is connected with the pull-up node, a gate electrode of the tenth transistor is connected with a reset signal terminal, and a second electrode of the tenth transistor is connected with the first power line.

7. A gate driving circuit, comprising the shift register according to claim 1.

8. A display device, comprising the gate driving circuit according to claim 7 and a display panel connected with the gate driving circuit.

9. A display device, comprising a gate driving circuit and a display panel connected with the gate driving circuit,
wherein the gate driving circuit comprises a shift register, the shift register comprises:
a driving unit, configured to supply a gate line signal to a corresponding pixel unit group; and
a compensation circuit provided corresponding to the driving unit, wherein the compensation circuit is configured to compensate for one or more threshold voltage offsets of one or more transistors in the driving unit, the compensation circuit comprises:

a compensation transistor, a gate electrode of the compensation transistor being connected with a compensation control line, a first electrode of the compensation transistor being connected with a first compensation signal line, and a second electrode of the compensation transistor being connected with a pull-up node, and the compensation control line is used for supplying a control signal to the gate electrode of the compensation transistor for controlling turning on of the compensation transistor; and the first compensation signal line is used for supplying a positive compensation voltage or a negative compensation voltage to the first electrode of the compensation transistor, and the display device further comprises:

a timing and temperature-measuring device, configured to measure an operation time and an operation temperature of a respective driving unit of the gate driving circuit when the display panel is operating, to obtain a threshold voltage offset state of a transistor in a pull-up circuit or a pull-down maintaining control circuit of the respective driving unit based on the measured operation time and operation temperature, and to calculate a compensation time period and a compensation voltage for the transistor according to the threshold voltage offset state;

a control device, configured to store the compensation voltage and the compensation time period calculated by the timing and temperature-measuring device, and to supply the compensation voltage to the compensation circuit corresponding to the respective driving unit of the gate driving circuit; and a built-in power supply, configured to supply power to the compensation circuit of the gate driving circuit and the control device.

10. The display device according to claim 9, wherein:

the control device is further configured to: supply the compensation voltage to the compensation circuit of the gate driving circuit, when it is determined that the display panel is in a shutdown state, wherein the compensation voltage is used for performing threshold voltage compensation on part of transistors in the pull-up circuit or the pull-down maintaining control circuit of the driving unit.

11. The display device according to claim 10, wherein the control device is further configured to supply the compensation voltage to the compensation circuit within the compensation time period.

12. The display device according to claim 10, wherein:

the compensation voltage comprises a positive compensation voltage or a negative compensation voltage;

when positive bias voltage compensation is executed, the control device transmits the positive compensation voltage to the first compensation signal line; and when negative bias voltage compensation is executed, the control device transmits the negative compensation voltage to the first compensation signal line.

13. A driving method for driving a shift register, the shift register comprising:

a driving unit, configured to supply a gate line signal to a corresponding pixel unit group; and a compensation circuit provided corresponding to the driving unit, wherein the compensation circuit is configured to compensate for one or more threshold voltage offsets of one or more transistors in the driving unit, the compensation circuit comprises:

a compensation transistor, a gate electrode of the compensation transistor being connected with a compensation control line, a first electrode of the compensation transistor being connected with a first compensation signal line, and a second electrode of the compensation transistor being connected with a pull-up node, and the compensation control line is used for supplying a control signal to the gate electrode of the compensation transistor for controlling turning on of the compensation transistor; and the first compensation signal line is used for supplying a positive compensation voltage or a negative compensation voltage to the first electrode of the compensation transistor, the driving method comprising:

in a charging phase, setting an input signal to a valid signal, setting a first clock signal to an invalid signal, setting a second clock signal to the valid signal, and setting a reset signal to an off voltage;

in an outputting phase, setting the input signal to the invalid signal, setting the first clock signal to the valid signal, setting the second clock signal to the invalid signal, and setting the reset signal to the off voltage;

in a discharging phase, setting the input signal to the invalid signal, setting the first clock signal to the invalid signal, setting the second clock signal to the invalid signal, and setting the reset signal to an on voltage;

in a maintaining phase, setting the input signal to the invalid signal, setting the first clock signal to the invalid signal, setting the second clock signal to the invalid signal, and setting the reset signal to the off voltage; and in a compensation phase, setting the input signal to the invalid signal, setting the first clock signal to the invalid signal, setting the second clock signal to the invalid signal, setting the reset signal to the off voltage, setting a compensation control signal to the on voltage and setting the first compensation signal line to transmit the valid signal within a compensation time period, or setting the second compensation signal line to transmit the valid signal within the compensation time period.

14. The driving method according to claim 13, wherein the invalid signal is a signal with a high voltage level and the valid signal is a signal with a low voltage level.

15. The driving method according to claim 13, wherein the valid signal is a signal with a high voltage level and the invalid signal is a signal with a low voltage level.

16. A driving method for driving a shift register, the shift register comprising:

a driving unit, configured to supply a gate line signal to a corresponding pixel unit group; and a compensation circuit provided corresponding to the driving unit, wherein the compensation circuit is configured to compensate for one or more threshold voltage offsets of one or more transistors in the driving unit;

the compensation circuit comprises a first compensation transistor and a second compensation transistor, the first compensation transistor being an N-type transistor and the second compensation transistor being a P-type transistor;

a gate electrode of the first compensation transistor is connected with a second compensation signal line and a first electrode of the first compensation transistor, and a second electrode of the first compensation transistor is connected with a pull-up node of the driving unit;

a gate electrode of the second compensation transistor is connected with the second compensation signal line and a first electrode of the second compensation transistor, and a second electrode of the second compensation transistor is connected with the pull-up node of the driving unit; and the second compensation signal line is used for supplying a compensation voltage to the first electrode of the first compensation transistor or the first electrode of the second compensation transistor, the driving method comprising:

in a charging phase, setting an input signal to a valid signal, setting a first clock signal to an invalid signal, setting a second clock signal to the valid signal, and setting a reset signal to an off voltage;

in an outputting phase, setting the input signal to the invalid signal, setting the first clock signal to the valid signal, setting the second clock signal to the invalid signal, and setting the reset signal to the off voltage;

in a discharging phase, setting the input signal to the invalid signal, setting the first clock signal to the invalid signal, setting the second clock signal to the invalid signal, and setting the reset signal to an on voltage;

in a maintaining phase, setting the input signal to the invalid signal, setting the first clock signal to the invalid signal, setting the second clock signal to the invalid signal, and setting the reset signal to the off voltage; and in a compensation phase, setting the input signal to the invalid signal, setting the first clock signal to the invalid signal, setting the second clock signal to the invalid signal, setting the reset signal to the off voltage, setting a compensation control signal to the on voltage and setting the first compensation signal line to transmit the valid signal within a compensation time period, or setting the second compensation signal line to transmit the valid signal within the compensation time period.

* * * * *